United States Patent
Connell et al.

(10) Patent No.: US 7,169,685 B2
(45) Date of Patent: Jan. 30, 2007

(54) WAFER BACK SIDE COATING TO BALANCE STRESS FROM PASSIVATION LAYER ON FRONT OF WAFER AND BE USED AS DIE ATTACH ADHESIVE

(75) Inventors: Michael E. Connell, Boise, ID (US); Tongbi Jiang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/082,372

(22) Filed: Feb. 25, 2002

(65) Prior Publication Data

US 2003/0162368 A1 Aug. 28, 2003

(51) Int. Cl.
H01L 21/301 (2006.01)
H01L 21/46 (2006.01)
H01L 21/78 (2006.01)

(52) U.S. Cl. ............... 438/460; 438/463; 438/464
(58) Field of Classification Search .......... 438/460–465
See application file for complete search history.

(56) References Cited

U.S. PATENT DOCUMENTS

| | | |
|---|---|---|
| 2,357,600 A | 9/1944 | Pabst |
| 2,413,767 A | 1/1947 | Hyde |
| 2,454,548 A | 11/1948 | Brinkert |
| 2,495,541 A | 1/1950 | Nolan, Jr. |
| 3,239,218 A | 3/1966 | Reeves |
| 3,254,776 A | 6/1966 | Brown |
| 3,327,889 A | 6/1967 | Dore |
| 3,625,384 A | 12/1971 | Boerger et al. |
| 3,628,672 A | 12/1971 | Heinz |
| 3,751,587 A | 8/1973 | Insler et al. |
| 3,774,352 A | 11/1973 | Weber |
| 3,799,017 A | 3/1974 | Halligan |
| 3,837,510 A | 9/1974 | McWilliams |
| 3,861,969 A * | 1/1975 | Ono et al. .................. 438/551 |
| 3,887,997 A | 6/1975 | Hartleroad et al. |
| 3,903,934 A | 9/1975 | Vizy |
| 3,917,983 A | 11/1975 | Kuronen |
| 3,937,386 A | 2/1976 | Hartleroad et al. |
| 3,969,813 A | 7/1976 | Minetti et al. |
| 3,973,665 A | 8/1976 | Giammanco |
| 4,024,545 A | 5/1977 | Dowling et al. |
| 4,027,246 A | 5/1977 | Caccoma et al. |
| 4,030,622 A | 6/1977 | Brooks et al. |
| 4,058,217 A | 11/1977 | Vaughn et al. |
| 4,095,095 A | 6/1978 | Mursoka et al. |
| 4,097,715 A | 6/1978 | Frizzi |
| 4,123,044 A | 10/1978 | Petzi |
| 4,148,057 A | 4/1979 | Jesse |
| 4,178,531 A | 12/1979 | Alig |
| 4,203,486 A | 5/1980 | Rubbright et al. |
| 4,285,433 A | 8/1981 | Garrett, Sr. et al. |
| 4,323,755 A | 4/1982 | Nierenberg |
| 4,346,284 A | 8/1982 | Grollimund et al. |
| 4,352,617 A | 10/1982 | Sakai et al. |
| 4,353,796 A | 10/1982 | Kubo et al. |
| 4,354,770 A | 10/1982 | Block |
| 4,370,542 A | 1/1983 | Mills et al. |

(Continued)

FOREIGN PATENT DOCUMENTS

CA 843232 6/1970

(Continued)

*Primary Examiner*—Michael Lebentritt
*Assistant Examiner*—AndréC. Stevenson
(74) *Attorney, Agent, or Firm*—Trask Britt

(57) ABSTRACT

A method for balancing layer-caused compressive or tensile stress in a semiconductor die, die wafer or similar substrate uses a stress-balancing layer (SBL) attached to the opposite side from the stress-causing layer before the die or wafer is significantly warped are provided. The SBL may also serve as, or support, an adhesive layer for die attach, and be of a markable material for an enhance marking method.

74 Claims, 5 Drawing Sheets

U.S. PATENT DOCUMENTS

| | | |
|---|---|---|
| 4,375,025 A | 2/1983 | Carlson |
| 4,382,580 A | 5/1983 | Hellander |
| 4,403,134 A | 9/1983 | Klingel |
| 4,454,413 A | 6/1984 | Morton, Jr. |
| 4,461,073 A | 7/1984 | Harringer et al. |
| 4,493,767 A | 1/1985 | Monteyne |
| 4,510,673 A | 4/1985 | Shils et al. |
| 4,513,539 A | 4/1985 | Steinback |
| 4,517,436 A | 5/1985 | Lawrence |
| 4,523,319 A | 6/1985 | Pfost |
| 4,534,695 A | 8/1985 | Stump et al. |
| 4,539,878 A | 9/1985 | Linker et al. |
| 4,543,716 A | 10/1985 | Damiano et al. |
| 4,552,271 A | 11/1985 | Kranz |
| 4,561,541 A | 12/1985 | Lawrence |
| 4,577,563 A | 3/1986 | Sidler |
| 4,585,931 A | 4/1986 | Duncan et al. |
| 4,594,263 A | 6/1986 | Folk et al. |
| 4,607,744 A | 8/1986 | Pak |
| 4,610,359 A | 9/1986 | Muller |
| 4,616,414 A | 10/1986 | Cushman |
| 4,626,656 A | 12/1986 | Ootsuka et al. |
| 4,630,513 A | 12/1986 | Keller |
| 4,638,144 A | 1/1987 | Latta, Jr. |
| D288,273 S | 2/1987 | Gould |
| 4,644,126 A | 2/1987 | Schumacher |
| 4,654,290 A | 3/1987 | Spanjer |
| 4,660,282 A | 4/1987 | Pfaff |
| 4,665,298 A | 5/1987 | La Rocca |
| 4,677,370 A | 6/1987 | Tustaniwskyj et al. |
| 4,696,096 A | 9/1987 | Green et al. |
| 4,702,788 A | 10/1987 | Okui |
| 4,707,722 A | 11/1987 | Folk et al. |
| 4,711,334 A | 12/1987 | Harry et al. |
| 4,718,531 A | 1/1988 | Bianchi et al. |
| 4,719,502 A | 1/1988 | Ikeya et al. |
| 4,720,317 A | 1/1988 | Kuroda et al. |
| 4,749,631 A | 6/1988 | Haluska et al. |
| 4,753,863 A | 6/1988 | Spanjer |
| 4,756,977 A | 7/1988 | Haluska et al. |
| 4,759,675 A | 7/1988 | Bond et al. |
| 4,767,984 A | 8/1988 | Bakker |
| 4,769,345 A | 9/1988 | Butt et al. |
| 4,772,079 A | 9/1988 | Douglas et al. |
| 4,778,326 A | 10/1988 | Althouse et al. |
| 4,790,515 A | 12/1988 | Pocci |
| 4,791,267 A | 12/1988 | Yokoyama et al. |
| 4,818,835 A | 4/1989 | Kuwabara et al. |
| 4,821,151 A | 4/1989 | Pryor et al. |
| 4,832,612 A | 5/1989 | Grabbe et al. |
| 4,850,780 A | 7/1989 | Safabakjsh et al. |
| 4,861,620 A | 8/1989 | Azuma et al. |
| 4,884,420 A | 12/1989 | Finkel et al. |
| 4,891,242 A | 1/1990 | Ito et al. |
| 4,914,269 A | 4/1990 | Kinsman et al. |
| 4,916,293 A | 4/1990 | Cartlidge et al. |
| 4,926,677 A | 5/1990 | Waldner |
| 4,944,492 A | 7/1990 | Nonaka |
| 4,945,204 A | 7/1990 | Nakamura et al. |
| 4,947,981 A | 8/1990 | Dorner et al. |
| 4,965,927 A | 10/1990 | Holzman |
| 4,967,260 A | 10/1990 | Butt |
| 4,990,051 A | 2/1991 | Safabakkah et al. |
| 5,003,251 A | 3/1991 | Fuoco |
| H906 H | 4/1991 | Baggett et al. |
| 5,014,159 A | 5/1991 | Butt |
| 5,018,938 A | 5/1991 | Sikorski |
| 5,020,959 A | 6/1991 | Soth |
| 5,030,551 A | 7/1991 | Herren et al. |
| 5,043,657 A | 8/1991 | Amazeen et al. |
| 5,090,664 A | 2/1992 | McCullough et al. |
| 5,102,291 A | 4/1992 | Hine |
| 5,113,992 A | 5/1992 | Sadamori |
| 5,117,963 A | 6/1992 | Thayer et al. |
| 5,118,369 A | 6/1992 | Shamir |
| 5,127,837 A | 7/1992 | Shah et al. |
| 5,128,737 A | 7/1992 | van der Have |
| 5,148,969 A | 9/1992 | Boucher et al. |
| 5,150,797 A | 9/1992 | Shibata |
| 5,157,412 A | 10/1992 | Kleinschmidt et al. |
| 5,158,818 A | 10/1992 | Aurichio |
| 5,175,774 A | 12/1992 | Truax et al. |
| 5,177,368 A | 1/1993 | Kay |
| 5,183,783 A * | 2/1993 | Ohta et al. .................. 438/404 |
| 5,197,650 A | 3/1993 | Monzen et al. |
| 5,203,143 A | 4/1993 | Gutentag |
| 5,204,987 A | 4/1993 | Klingel |
| 5,206,280 A | 4/1993 | Williams |
| 5,218,894 A | 6/1993 | College et al. |
| 5,219,765 A | 6/1993 | Yoshida et al. |
| 5,220,754 A | 6/1993 | Tayebi et al. |
| 5,226,361 A | 7/1993 | Grant et al. |
| 5,245,166 A | 9/1993 | Shepard |
| 5,245,900 A | 9/1993 | Dojnik |
| 5,256,578 A | 10/1993 | Corley et al. |
| 5,260,542 A | 11/1993 | Ishiguro et al. |
| 5,262,470 A | 11/1993 | Shimotsuma et al. |
| 5,263,567 A | 11/1993 | Costa |
| 5,268,059 A | 12/1993 | Olson |
| 5,278,442 A | 1/1994 | Prinz et al. |
| 5,279,975 A | 1/1994 | Devereaux et al. |
| 5,289,113 A | 2/1994 | Meaney et al. |
| 5,290,134 A | 3/1994 | Baba |
| 5,294,812 A | 3/1994 | Hashimoto et al. |
| 5,295,778 A | 3/1994 | Hirai et al. |
| 5,299,902 A | 4/1994 | Fujiwara et al. |
| 5,300,172 A | 4/1994 | Ishiwata et al. |
| 5,301,143 A | 4/1994 | Ohri et al. |
| 5,302,798 A | 4/1994 | Inagawa et al. |
| 5,307,010 A | 4/1994 | Chiu |
| 5,313,156 A | 5/1994 | Klug et al. |
| 5,315,094 A | 5/1994 | Lisy |
| 5,322,173 A | 6/1994 | Kay |
| 5,323,051 A | 6/1994 | Adams |
| 5,329,090 A | 7/1994 | Woelki et al. |
| 5,332,463 A | 7/1994 | Eberlein et al. |
| 5,335,458 A | 8/1994 | Stoffers et al. |
| 5,336,928 A | 8/1994 | Neugebauer |
| 5,346,802 A | 9/1994 | Ohbachi et al. |
| 5,357,077 A | 10/1994 | Tsuruta |
| 5,360,747 A | 11/1994 | Larson et al. |
| 5,365,653 A | 11/1994 | Padrun |
| 5,373,039 A | 12/1994 | Sakai et al. |
| 5,375,320 A | 12/1994 | Kinsman et al. |
| 5,379,514 A | 1/1995 | Okuda et al. |
| 5,399,828 A | 3/1995 | Riddle et al. |
| 5,402,563 A | 4/1995 | Satoh et al. |
| 5,413,629 A | 5/1995 | Yasui et al. |
| 5,415,939 A | 5/1995 | Yeung |
| 5,417,408 A | 5/1995 | Ueda |
| 5,423,716 A | 6/1995 | Strasbaugh |
| 5,423,931 A | 6/1995 | Inoue et al. |
| 5,427,349 A | 6/1995 | Obrecht |
| 5,445,923 A | 8/1995 | Takahashi et al. |
| 5,448,488 A | 9/1995 | Oshima |
| 5,454,900 A | 10/1995 | Han et al. |
| 5,455,459 A | 10/1995 | Fillion et al. |
| 5,458,158 A | 10/1995 | Kawanabe |
| 5,463,227 A | 10/1995 | Stern et al. |
| 5,465,470 A | 11/1995 | Vongfuangfoo et al. |
| 5,466,908 A | 11/1995 | Hosoya et al. |

| | | | | | | |
|---|---|---|---|---|---|---|
| 5,467,023 A | 11/1995 | Takeyama | | 5,927,512 A | 7/1999 | Beffa |
| 5,479,694 A | 1/1996 | Baldwin | | 5,928,842 A | 7/1999 | Shinmoto et al. |
| 5,481,135 A | 1/1996 | Chandra et al. | | 5,932,119 A | 8/1999 | Kaplan et al. |
| 5,481,202 A | 1/1996 | Frye, Jr. | | 5,937,270 A | 8/1999 | Canella |
| 5,484,314 A | 1/1996 | Farnworth | | 5,942,136 A | 8/1999 | Mori et al. |
| 5,487,471 A | 1/1996 | Marchek et al. | | 5,946,791 A | 9/1999 | Baldwin |
| 5,496,432 A | 3/1996 | Sumi et al. | | 5,962,097 A | 10/1999 | Yamamoto et al. |
| 5,497,033 A | 3/1996 | Fillion et al. | | 5,966,307 A | 10/1999 | Lin |
| 5,498,851 A | 3/1996 | Hayashi et al. | | 5,972,234 A | 10/1999 | Weng et al. |
| D371,021 S | 6/1996 | Pine et al. | | 5,976,955 A | 11/1999 | Hodges |
| 5,534,094 A | 7/1996 | Arjavalingam et al. | | 5,985,377 A | 11/1999 | Corbett |
| 5,545,367 A | 8/1996 | Bae et al. | | 5,985,510 A | 11/1999 | Akutsu et al. |
| 5,547,906 A | 8/1996 | Badehi | | 5,986,235 A | 11/1999 | Canella |
| 5,551,959 A | 9/1996 | Martin et al. | | 5,991,245 A | 11/1999 | Yohimura |
| 5,566,414 A | 10/1996 | Nonaka | | 5,999,252 A | 12/1999 | Greisz |
| 5,566,840 A | 10/1996 | Waldner et al. | | 6,008,070 A | 12/1999 | Farworth |
| 5,587,094 A | 12/1996 | Yoshida et al. | | 6,008,476 A | 12/1999 | Neiconi et al. |
| 5,588,797 A | 12/1996 | Smith | | 6,011,315 A | 1/2000 | Toyosawa et al. |
| 5,590,787 A | 1/1997 | Hodges | | 6,023,042 A | 2/2000 | Hensel et al. |
| 5,600,150 A | 2/1997 | Stern et al. | | 6,028,134 A | 2/2000 | Zhang et al. |
| 5,600,181 A | 2/1997 | Scott et al. | | 6,030,485 A | 2/2000 | Yamada |
| 5,605,641 A | 2/1997 | Chiba et al. | | 6,062,119 A | 5/2000 | Overgaard |
| 5,629,484 A | 5/1997 | Liska | | 6,070,731 A | 6/2000 | Kobayashi et al. |
| 5,632,083 A | 5/1997 | Tada et al. | | 6,084,288 A | 7/2000 | Farnworth et al. |
| 5,632,915 A | 5/1997 | Schnetzer et al. | | 6,100,486 A | 8/2000 | Beffa |
| 5,635,766 A | 6/1997 | Cain | | 6,108,026 A | 8/2000 | Corbett |
| 5,638,958 A | 6/1997 | Sanchez | | 6,113,992 A | 9/2000 | Corbett |
| 5,643,477 A | 7/1997 | Gullo et al. | | 6,122,563 A | 9/2000 | Beffa |
| 5,648,136 A | 7/1997 | Bird | | 6,137,125 A | 10/2000 | Costas et al. |
| 5,653,900 A | 8/1997 | Clement et al. | | 6,138,542 A | 10/2000 | Overgaard |
| 5,654,204 A | 8/1997 | Anderson | | 6,153,034 A | 11/2000 | Lipsker |
| 5,656,548 A | 8/1997 | Zavracky et al. | | 6,154,366 A | 11/2000 | Ma et al. |
| 5,663,096 A * | 9/1997 | Okabe et al. ............... 438/268 | | 6,188,129 B1 | 2/2001 | Paik et al. |
| 5,665,609 A | 9/1997 | Mori | | 6,202,292 B1 | 3/2001 | Farnworth et al. |
| 5,682,065 A | 10/1997 | Farnworth et al. | | 6,229,323 B1 | 5/2001 | Tverdy et al. |
| 5,691,544 A | 11/1997 | Stern et al. | | 6,244,569 B1 | 6/2001 | Canella et al. |
| 5,692,873 A | 12/1997 | Weeks et al. | | 6,244,634 B1 | 6/2001 | Robinson |
| 5,701,084 A * | 12/1997 | Borthwick et al. ......... 324/690 | | 6,287,068 B1 | 9/2001 | Canella et al. |
| 5,715,592 A | 2/1998 | Mori et al. | | 6,303,471 B1 * | 10/2001 | Unno et al. ................. 438/464 |
| 5,717,162 A | 2/1998 | Matsuoka | | 6,323,060 B1 * | 11/2001 | Isaak .......................... 438/109 |
| 5,719,372 A | 2/1998 | Togari et al. | | 6,352,803 B1 | 3/2002 | Tong et al. |
| 5,722,639 A | 3/1998 | Nonaka | | 6,380,558 B1 | 4/2002 | Yamazaki et al. |
| 5,728,624 A | 3/1998 | Linn et al. | | 6,444,490 B2 * | 9/2002 | Bertin et al. ................. 438/107 |
| 5,761,301 A | 6/1998 | Oshima et al. | | 6,489,178 B2 * | 12/2002 | Coyle et al. .................. 438/51 |
| 5,765,277 A | 6/1998 | Jin et al. | | 6,524,881 B1 | 2/2003 | Tandy et al. |
| 5,780,311 A * | 7/1998 | Beasom et al. ............. 438/406 | | 6,579,748 B1 * | 6/2003 | Okuno et al. ............... 438/124 |
| 5,793,051 A | 8/1998 | Stern et al. | | 6,585,927 B2 | 7/2003 | Grigg et al. |
| 5,801,067 A | 9/1998 | Shaw et al. | | 6,603,191 B2 * | 8/2003 | Wakabayashi et al. ....... 257/620 |
| 5,801,084 A * | 9/1998 | Beasom et al. ............. 438/457 | | 6,656,820 B2 * | 12/2003 | Liu .......................... 438/460 |
| 5,805,472 A | 9/1998 | Fukasawa | | 6,692,978 B2 | 2/2004 | Tandy et al. |
| 5,808,268 A | 9/1998 | Balz et al. | | 6,737,201 B2 | 5/2004 | Shoki et al. |
| 5,821,497 A | 10/1998 | Yamazaki et al. | | 2002/0048906 A1 * | 4/2002 | Sakai et al. ................. 438/464 |
| 5,827,711 A * | 10/1998 | Lal et al. .................... 435/191 | | 2003/0017626 A1 | 1/2003 | Hilt et al. |
| 5,827,771 A * | 10/1998 | Ginn et al. .................. 438/457 | | 2003/0017652 A1 * | 1/2003 | Sakai et al. ................. 438/123 |
| 5,829,115 A | 11/1998 | Speller, Jr. et al. | | 2003/0011765 A1 * | 3/2003 | Coyle et al. ................. 438/106 |
| 5,838,361 A | 11/1998 | Corbett | | 2003/0207095 A1 | 11/2003 | Lowack et al. |
| 5,838,431 A | 11/1998 | Hara et al. | | | | |
| 5,840,614 A | 11/1998 | Sim et al. | | | | |
| 5,844,803 A | 12/1998 | Beffa | | | | |
| 5,855,969 A | 1/1999 | Robertson | | | | |

FOREIGN PATENT DOCUMENTS

| | | |
|---|---|---|
| 5,856,230 A * 1/1999 Jang ........................... 438/439 | DE | 243 798 | 3/1987 |
| 5,856,923 A 1/1999 Jones et al. | EP | 0 653 791 A1 | 10/1994 |
| 5,866,644 A 2/1999 Mercx et al. | EP | 0 653 791 | 5/1995 |
| 5,870,820 A 2/1999 Arakawa et al. | FR | 1.284.603 | 1/1961 |
| 5,875,544 A 3/1999 Chou | JP | 57-53955 | 3/1982 |
| 5,893,760 A * 4/1999 Mikata et al. ............... 438/795 | JP | 61-297047 | 12/1986 |
| 5,903,044 A 5/1999 Farnworth et al. | JP | 62-244591 | 10/1987 |
| 5,907,492 A 5/1999 Akram et al. | JP | 63171714 | 7/1988 |
| 5,909,706 A 6/1999 Jin et al. | JP | 63-202521 | 8/1988 |
| 5,911,461 A 6/1999 Sauter et al. | JP | 1-100677 | 4/1989 |
| 5,915,231 A 6/1999 Beffa | JP | 2-205281 | 8/1990 |

| | | | | | |
|---|---|---|---|---|---|
| JP | 466416 | 3/1992 | JP | 6-326203 | 11/1994 |
| JP | 5-69164 | 3/1993 | | | |
| JP | 6-226472 | 8/1994 | | | |
| JP | 06314899 A | 11/1994 | * cited by examiner | | |

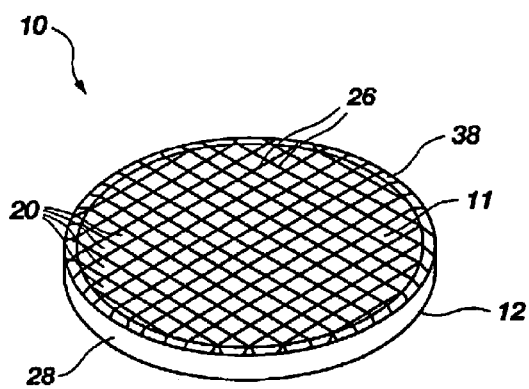
Fig. 1
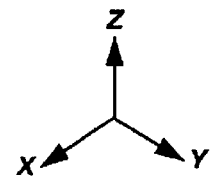
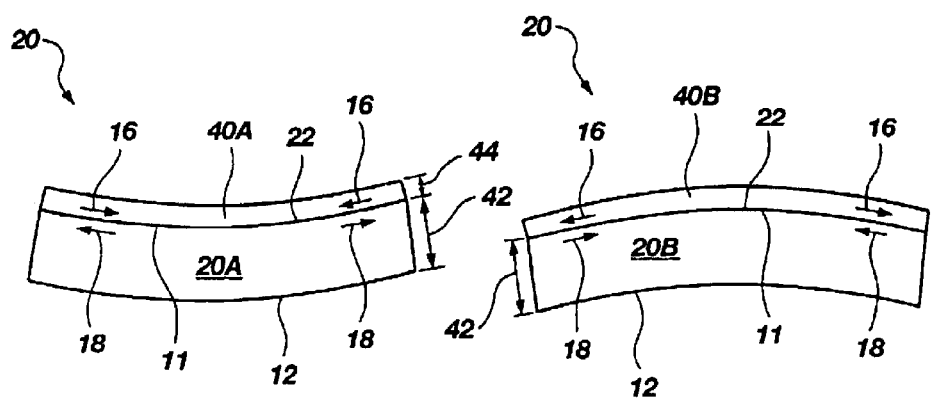
Fig. 2A
(PRIOR ART)
Fig. 2B
(PRIOR ART)

Slice

Grind & Polish

Fabricate

Apply Passiv. Layer

Grind Backside

Apply Stress-Balance Layer

Cure Stress-Balance Layer

Singulate Dice

WAFER BACK SIDE COATING TO BALANCE STRESS FROM PASSIVATION LAYER ON FRONT OF WAFER AND BE USED AS DIE ATTACH ADHESIVE

BACKGROUND OF THE INVENTION

1. Field of the Invention

The present invention relates to methods for making semiconductor dice. More specifically, the invention relates to methods and apparatus for balancing stress in a semiconductor die resulting from stress within a top side protective layer.

2. State of the Art

An individual integrated circuit semiconductor die is usually formed from a larger structure known as a semiconductor wafer. Wafers are usually formed by slicing a large cylindrically shaped crystal of silicon, although other materials such as gallium arsenide and indium phosphide are also used. The front side or surface of the wafer is first ground and polished to a smooth surface, for fabrication of multiple integrated circuits thereon. Each semiconductor wafer has a plurality of integrated circuits arranged in rows and columns with the periphery of each integrated circuit typically being substantially rectangular. In the electronics industry, there is a need for apparatus of smaller size, higher performance and higher memory storage. These factors drive the industry to produce smaller semiconductor dice by thinning each wafer, i.e., reducing the cross section using a mechanical and/or chemical grinding process or etching. After thinning, the wafer is sawn or diced into rectangularly shaped "dice" along two mutually perpendicular sets of parallel lines or streets separating each row and column of dice in the wafer. Thus, the individual integrated circuit semiconductor die in the form of semiconductor dice are singulated from the wafer.

Fabrication of the integrated circuits is performed on the active surface of the undivided wafer, and consists of various processes including known steps of layering, patterning, doping, etching and heat treatment, for example. Various layers applied to the active surface of the wafer typically include insulators, semiconductors and metallic conductors. The final layering step generally comprises the application of a passivation material to cover the integrated circuit with a smooth electrically insulative protective layer. The purpose of the passivation layer is to protect the electronic components on the active surface, i.e., front side during subsequent wafer thinning, die testing, die singulation from the wafer, die packaging, and use. Exemplary passivation materials include silicon dioxide and silicon nitride (doped or undoped with boron or phosphorus, for example), as well as other materials including polymer-based compositions as known in the art. Further protection from damage during thinning of the wafer back side may be provided by temporarily attaching an adhesive-backed polymer (e.g. vinyl) sheet to the front side of the wafer. Such is disclosed in U.S. Pat. No. 5,840,614 of Sim et al. and U.S. Pat. No. 6,030,485 of Yamada, in which a UV sensitive tape is attached to the active surface of a wafer and made removable by radiation following back side lapping. In U.S. Pat. No. 5,962,097 of Yamamoto et al., a protective member is removably attached to an active surface of a wafer by a pressure sensitive adhesive.

Wafer thinning is performed in order to (a) reduce the package size, (b) reduce the consumption of saw blades in subsequent die singulation from the wafer, and (c) remove any electrical junctions which have formed on the wafer back side during fabrication. The processes typically used for wafer thinning include mechanical grinding and chemical-mechanical polishing (CMP). Alternatively, etching may be used but is not generally preferred. Each of these processes requires protection of the front side or active surface of the wafer containing the electronic components of the semiconductor die and/or wafer. The wafer grinding/polishing step typically results in a somewhat rough back side which is not conducive to other semiconductor die manufacturing processes, such as direct laser marking of a semiconductor die.

Although wafer thinning produces semiconductor dice of much reduced size, it also tends to result in a higher incidence of semiconductor die breakage. In addition, stresses induced by any grinding and polishing processes must be carefully controlled to prevent wafer and semiconductor die warping or bowing. Wafer warp interferes with precise semiconductor die separation (singulation), and semiconductor die warping results in die-attach problems in subsequent packaging. In addition, warping may cause breakage of wire bonds, etc.

Stresses produced in a semiconductor die by application of a layer thereto may be classified as either "intrinsic" or result from "thermal mismatch" between the material of the semiconductor die and the material of the applied layer. In the former case, the applied layer may be in tensile or compressive stress as applied or cured. For example, a polymeric layer may shrink during a curing step to produce intrinsic compressive stress in the active surface of a semiconductor die to which it is attached. Stress resulting from thermal mismatch is particularly evident where the layer deposition is not done at room temperature. Upon cooling to ambient temperature or to a working temperature, different coefficients of expansion (CTE) result in differential contraction or expansion between the semiconductor die substrate, the wafer, and the applied layer. Each of these stress components is important in the fabrication of semiconductor die, particularly where the ratio of semiconductor die thickness to semiconductor die length (or width) is very low.

Application of an effective passivation layer to the front side of a wafer typically results in stresses in the wafer and the semiconductor die singulated therefrom. Stresses introduced by the passivation layer may be sufficient to produce undesirable warping in the semiconductor dice, particularly where the wafer has been thinned to a high degree. A rigid unwarped substrate is particularly critical in forming known-good-die (KGD) with wire bonds.

In one sawing method of singulation, the wafer back side is attached to a flexible plastic film to hold the individual semiconductor die in place during cutting. The film is subsequently separated and removed from the singulated semiconductor die, and has no effect upon die warping. In one version, the film is stretched to release the semiconductor dice, which are then simply picked off the film. The semiconductor dice may then be processed to form differing types of semiconductor packages.

In one commonly used die-attach method, an adhesive material (e.g., epoxy) is used to join the back side of a die to a carrier. The adhesive material may be insulative or be electrically conductive and heat conductive.

Layer formation on a wafer back side has been done for another purpose. Such layers have been applied to provide a smooth surface for marking a semiconductor die or wafer with indicia identifying the manufacturer, serial number, lot number, and/or bar code, for example.

Conventional laser marking techniques utilize a very high intensity beam of light to alter the surface of a semiconductor die by melting, burning, or ablating the device surface directly, or by discoloration or decoloration of a laser reactive coating applied to a surface of the bare semiconductor die or packaged semiconductor die. The beam of light may be scanned over the surface of the bare or packaged semiconductor die in the requisite pattern, or can be directed through a mask which projects the desired inscriptions onto the desired surface of the bare or packaged semiconductor die. The surface or coating of the semiconductor die thus modified, the laser marking creates a reflectivity difference from the rest of the surface of the semiconductor die.

Numerous methods for laser marking are known in the art. One method of laser marking involves applications where a laser beam is directed to contact the surface of a semiconductor device directly, as shown in U.S. Pat. No. 5,357,077 to Tsuruta, U.S. Pat. No. 5,329,090 to Woelki et al., U.S. Pat. No. 4,945,204 to Nakamura et al., U.S. Pat. No. 4,638,144 to Latta, Jr., U.S. Pat. No. 4,585,931 to Duncan et al., and U.S. Pat. No. 4,375,025 to Carlson.

Another method of laser marking makes use of various surface coating, e.g., carbon black and zinc borate, of a different color than the underlying device material. Two examples of this type of marking are described in U.S. Pat. No. 5,985,377 to Corbett and U.S. Pat. No. 4,707,722 to Folk et al.

In U.S. Pat. No. 5,866,644 to Mercx et al., molding compounds are disclosed which form products which may be laser marked. The molding compound contains a pigment as well as glass fibers for reinforcing the molded object.

The above-indicated methods have been found to be inadequate for marking the back side of a wafer or semiconductor die, inasmuch as the thinning methods, including mechanical grinding, chemical mechanical polishing, and etching all leave the back side in a nonsmooth condition with a surface topography unsuited for laser marking (with or without a thin surface coating).

Moreover, none of the coatings, if applied to the back side of a wafer or semiconductor die, will balance wafer stress or semiconductor die stress to prevent or significantly reduce warp.

BRIEF SUMMARY OF THE INVENTION

The present invention provides a method for balancing stresses resulting from application of a passivation layer or other layer on the front side of a semiconductor wafer. The term "passivation layer" will be used herein to denote any front side layer (compressive or tensile) which creates stress in the singulated die tending to form warp. The method and apparatus have particular application to wafers or semiconductor die which have been subjected to a thinning process, including backgrinding in particular. The present method comprises application of a stress-balancing layer (SBL) on the opposite side from a stress-creating layer such as a photoresist passivation layer, for example. Thus, a passivation layer covering the circuitry of each semiconductor die of a wafer will typically introduce compressive stresses into the dice; a stress-balancing layer (SBL) which is applied after wafer thinning but before singulation will result in individual semiconductor die in which the front side stresses and back side stresses are balanced, preventing dice warp.

The stress-balancing layer may be formed of a rigid material which resists deformation. The stress-balancing layer may be formed to have mechanical properties similar to the passivation layer and be applied under similar conditions so that the stress it creates on the die back side will approximately equal the stress on the die front side. The composition and thickness of the SBL may be varied to provide the desired balancing stress forces.

The stress-balancing layer may be applied by various methods. In a preferred method, an SBL may be applied by a chemical vapor deposition (CVD), epitaxy or other process over portions or all of the wafer back side. In particular, various CVD processes permit a uniform layer of material to be accurately deposited. Other methods which may be used to form the SBL on the back side include various evaporation methods and molecular beam epitaxy (MBE), for example.

The stress-balancing layer may comprise a composite of two or more materials. For example, semiconductor die having large aspect ratios may have formed thereon a rigid composite SBL having different reinforcing properties in the X and Y directions. Alternatively, two or more materials may be sequentially formed on the thinned wafer back side as a multilayer composite. Preferably, however, the stress-balancing layer comprises a single layer of a matrix material containing distributed particles of a reinforcing component which provide rigidity in the X-Y plane, and more preferably, in all directions. Careful selection of materials enables the SBL to be a very thin layer which contributes little to the overall Y-dimension of a die. The stress balancing layer of this invention is generally intended to be a permanent part of a semiconductor die. An exception to this rule is when a stress-causing layer requiring an SBL is subsequently removed or its stress causing effect otherwise ameliorated, in which case the SBL may optionally be removed. Inasmuch as the SBL is a very thin layer, and its removal would weaken the semiconductor die, it is generally considered to be a permanent part of the semiconductor die. Furthermore, the SBL may serve other purposes. For example, the SBL or adhesive applied thereto may comprise a laser markable material for applying indicia to each individual semiconductor die, as discussed infra. Also, the SBL may itself comprise an adhesive material useful for bonding the die back side to a substrate such as a circuit board.

In another aspect of the invention, an adhesive layer is applied to the highly planar stress-balancing layer for back side semiconductor die attachment to a package substrate, etc.

Application of the invention results in improved ease in the manufacture of semiconductor dice, with improved semiconductor die quality (planarity and wire bonds), and concomitant reduction in defective semiconductor die.

BRIEF DESCRIPTION OF THE SEVERAL VIEWS OF THE DRAWINGS

The nature of the present invention as well as other embodiments thereof may be more clearly understood by reference to the following detailed description of the invention, to the appended claims, and to the several drawings herein, wherein dimensions may be exaggerated for the sake of clarity, and wherein:

FIG. 1 is a schematic perspective view of a multidie semiconductor wafer that has been thinned and with visible die-separating streets;

FIG. 2A is a cross-sectional view of a semiconductor die with compressive stress applied thereto by a passivation layer on its front side to create die warp;

FIG. 2B is a cross-sectional view of a semiconductor die with tensile stress applied thereto by a passivation layer on its front side to create die warp;

FIGS. 3 through 10 are cross-sectional edge views of a portion of a semiconductor wafer during manufacturing processes to form semiconductor dice in accordance with the invention, wherein:

FIG. 3 is a cross-sectional view of a raw sliced wafer;

FIG. 4 is a cross-sectional view of a wafer following front side grinding and polishing;

FIG. 5 is a cross-sectional view of a wafer showing a plurality of representative electronic devices fabricated on the front side thereof;

FIG. 6 is a cross-sectional view of a wafer following deposition of a passivation layer over the electronic devices fabricated on the front side thereof;

FIG. 7 is a cross-sectional view of a wafer following back side thinning;

FIG. 8 is a cross-sectional view of a wafer following application of a stress-balancing layer on the thinned back side thereof;

FIG. 9 is a cross-sectional view of a wafer following curing of a stress-balancing layer on the thinned back side thereof;

FIG. 10 is a cross-sectional view of a semiconductor die following singulation of a wafer;

DETAILED DESCRIPTION OF THE INVENTION

Figure 3:
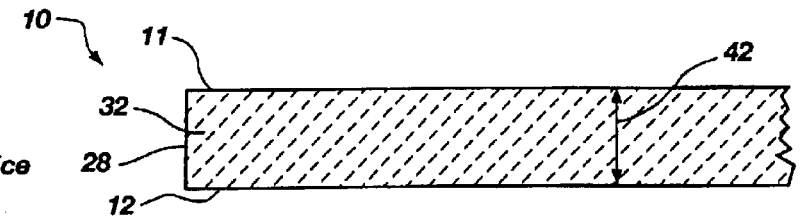

The present invention relates to semiconductor dice 20 formed in a multidie wafer 10 as shown in FIG. 1. As depicted, wafer 10 is typically circular in shape with a circumferential edge 28. The circumferential edge 28 is shown with an optional upper beveled surface 38 for ease of handling without breakage. The wafer 10 may optionally be of another shape. Semiconductor dice 20 are configured with opposing major surfaces, front side or active surface 11 and back side 12. Electronic components, not shown in this figure, are fabricated in the wafer 10 front side, i.e., active surface 11 and will be identified herein as integrated circuits. Each semiconductor die 20 of the wafer 10 is bounded by "streets" or saw lines 26 in both the X and Y directions and has an integrated circuit with bond pads thereon. The back side 12 of wafer 10 typically is free from circuitry. Following fabrication of the integrated circuits, a layer 40A (FIG. 2A) of protective passivating material is typically applied to cover the circuitry and front side surfaces.

Turning now to FIG. 2A, a side cross-sectional view of a prior art semiconductor die 20A having a thickness 42 is shown with a passivation layer 40A having a thickness 44 joined to the front side 11. Some features are exaggerated for the sake of clarity. The passivation layer 40A is shown as having laterally "shrunk" relative to the semiconductor die 20A at the extant temperature, resulting in compressive lateral stress forces 16 acting at the die-layer interface 22. Reactive stress forces 18 in the semiconductor die 20A oppose the applied stress forces 16, and the stress forces 16, 18 result in what is denoted herein as compressive warp.

As shown in FIG. 2B, die 20B of a prior art is shown with passivation layer 40B joined to the front side 11. The passivation layer 40B has laterally "expanded" relative to the semiconductor die 20B, creating tensile lateral stress forces 16 acting at the die-layer interface 22. Reactive stress forces 18 in semiconductor die 20B oppose the applied stress forces 16, and the result is what is denoted herein as tensile warp.

The degree of warp, whether compressive or tensile, depends upon the aspect ratio of the semiconductor die 20 and the active stress forces 16, 18. Minimization or elimination of die warp is important to the manufacture of a high quality die with a minimum number of defects.

FIGS. 3 through 10 illustrate one embodiment of the method useful for balancing stresses in semiconductor dice 20.

A portion of a semiconductor wafer 10 is depicted in FIG. 3 as comprising a wafer substrate 32. The wafer 10 has a front side 11, an opposing back side 12, and a circumferential edge 28. The wafer 10 is sliced from a crystalline cylinder of a semiconductive material such as silicon, germanium, gallium arsenide, etc. which comprises the wafer substrate 32.

Figure 4:
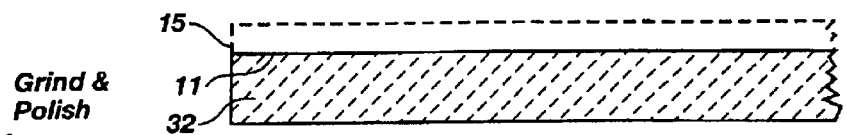

As shown in FIG. 4, the front side 11 of the wafer 10 is ground and polished to a smooth surface which becomes the active surface of each resulting semiconductor die 20. The portion 15 of the wafer substrate material removed from the wafer 10 reduces the wafer thickness 42. This planarization step is typically conducted by chemical-mechanical polishing (CMP).

Figure 5:
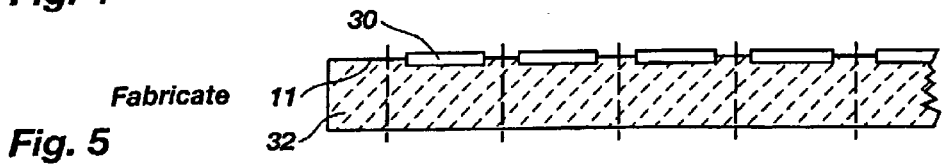

The integrated microcircuits 30 are then fabricated in accordance with a pattern on the front side (active surface) 11 of the wafer's substrate 32. As shown in FIG. 5, each microcircuit 30 is associated with a semiconductor die 20 which will be singulated along streets 26 in a later step. The microcircuit 30 typically comprises various electronic components such as transistors, diodes, resistors, capacitors, insulators, conductors, and the like, as known in the art. Typically, a series of conductive "bond pads" on the active surface permit electrical connection of the microcircuit 30 to a circuit board, a testing machine, or to the microcircuit of another die or dice. Each microcircuit 30 is configured to provide a desired electronic result in a very small space.

Figure 6:
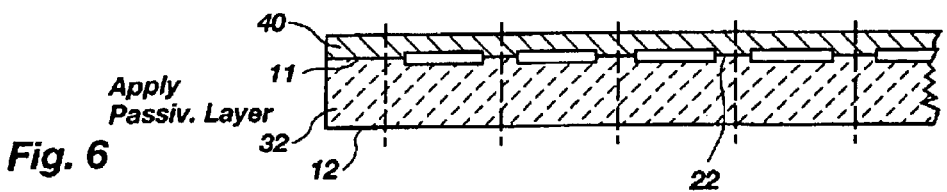

Referring now to FIG. 6, it is seen that an electrically insulative passivation layer 40 is typically applied to cover the microcircuit 30 following circuit fabrication. The passivation layer 40 protects the microcircuit 30 from damage during subsequent manufacturing steps as well as in ultimate use. Unprotected, the microcircuit 30 may be degraded by contamination, chemical action, corrosion, and/or handling. Passivation layer 40 may comprise any of a variety of materials, including silicon dioxide and silicon nitride as examples. Such materials are typically applied by a chemical vapor deposition (CVP) process at elevated temperature. Thus, a difference in coefficient of thermal expansion (CTE) between the passivation layer 40 and the die material to which it is applied will result in a residual stress in the wafer 10, and in dice 20 when the wafer is diced (die singulation). For example, silicon has a CTE which is several times the CTE of silicon dioxide and will contract much more than a silicon dioxide passivation layer upon cooling from an elevated temperature, creating stress which is concentrated at the interface 22 between the wafer 10 and the passivation layer 40.

Figure 7:
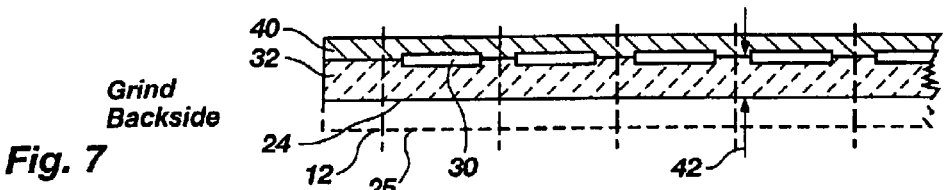

As depicted in FIG. 7, the back side 12 of the wafer 10 is then ground to reduce the wafer thickness 42 of the wafer substrate 32. In a conventional back-grinding process, illustrated in FIG. 11, a grinding wheel 52 with grinding surface 53 grinds away a portion 25 (see FIG. 7) of semiconductor wafer substrate 32 from the back side 12. Such grinding to fully thin the wafer thickness 42 typically leaves a somewhat nonsmooth ground surface 24 with grooves and/or swirls present. However, the unevenness makes the ground surface 24 conducive to later adhesive attachment of a stress-balancing layer 50 (FIG. 8) thereto.

Figure 11:
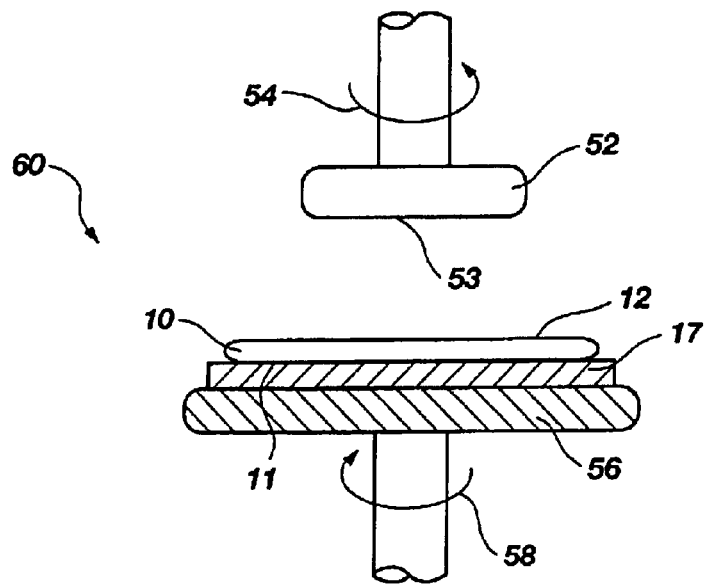
FIG. 11 is a simplified side view of a conventional backgrinding apparatus and semiconductor wafer mounted thereon.

As shown by the arrows in FIG. 11, grinding wheel 52 of backgrinding apparatus 60 typically rotates in one direction 54 while a platen 56 providing physical support for semiconductor wafer 10 rotates in another direction 58. This results in the grinding pattern referred to above, which tends to vary from one side of wafer 10 as opposed to the other. A submount 17, formed of tape, wax, molding compound, etc., typically provides protection for the active surface 11 of the unsingulated semiconductor die 20 formed on semiconductor wafer 10 as well as structural support during the thinning process.

Figure 8:
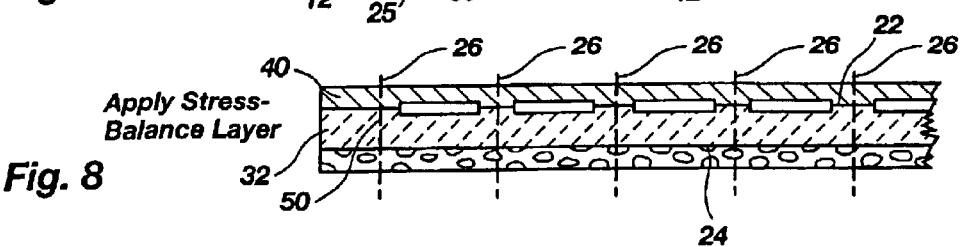

Turning now to FIG. 8, in accordance with this invention, a stress-balancing layer (SBL) 50 is applied to the ground surface 24 to balance the stress created by the passivation layer 40 in the wafer substrate 32. The SBL 50 is configured to adhere tightly to the ground surface 24 and to oppose warping stresses in the wafer 10 as well as in the subsequently singulated semiconductor die 20.

The stress-balancing layer 50 may be formed in a variety of ways. For example, the SBL 50 may comprise a single rigid layer or a multifilm layer with each layer formed to resist deformation in a different direction, or with different deformation properties. In another form, homogeneously distributed inorganic particles may be bound in a matrix for uniform stress resistance in an X-Y plane, or optionally, omnidirectional. The stress-balancing layer 50 may be formed of any material or materials which when applied in a thin layer to the back side semiconductor die ground surface 24, will provide a rigid structure resistant to warping of the semiconductor die 20.

Figure 9:
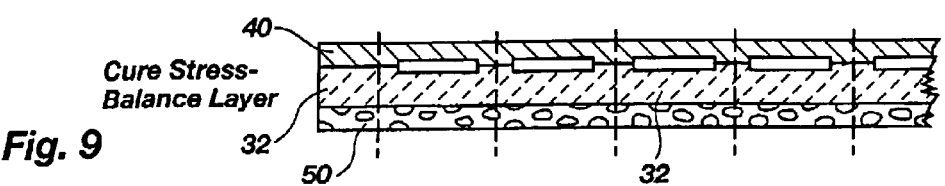
Figure 10:
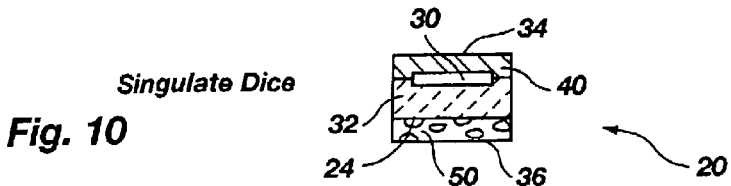

In the event that the stress-balancing layer 50 requires a curing step to fully harden the layer, it is conducted, typically by exposure to heat or radiation (see FIG. 9).

Figure 12:
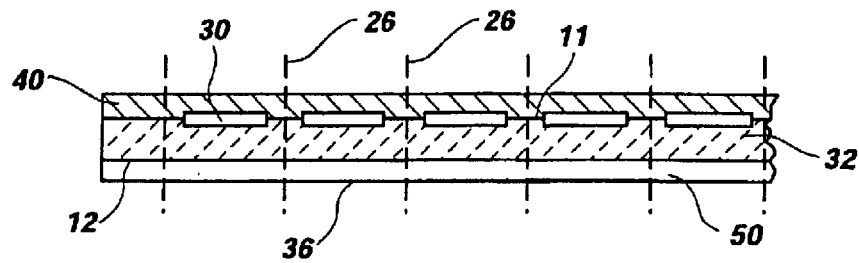
FIG. 12 is a cross-sectional view of a wafer of the invention wherein an applied stress-balancing layer comprises a single component or a homogeneous mixture of more than one component.

As shown in FIG. 12, an exemplary SBL 50 is shown as a single-component highly rigid layer such as, for example, a metal, alloy, metallorganic material, a photo-resist material or other material with the proper loadbearing characteristics.

Figure 13:
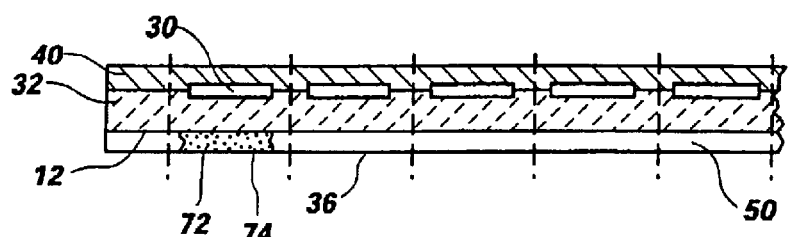
FIG. 13 is a cross-sectional view of a wafer of the invention wherein an applied stress-balancing layer comprises a heterogeneous mixture of a reinforcing material in a matrix base material.

In FIG. 13, SBL 50 is shown as a heterogeneous composite structure comprising uniformly distributed strong particles in a matrix material 74. For example, very small particles of reinforcing material 72 such as metal, glass, etc. may be distributed in a matrix material of silicon oxide, silicon nitride or a polymeric material.

Figure 14:
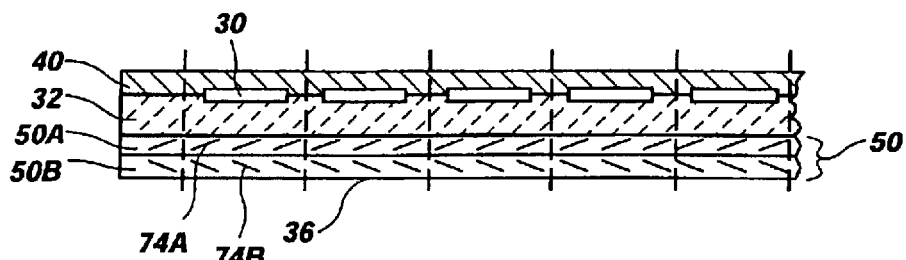
FIG. 14 is a cross-sectional view of a wafer of the invention wherein an applied stress-balancing layer comprises two separately applied sub-layers having reinforcement properties in different directions.

In a further embodiment shown in FIG. 14, two or more layers of composite materials (depicted as 50A and 50B) are sequentially deposited as a stress-balancing layer 50. Each layer is shown with a reinforcing material 74A or 74B configured to resist stresses (i.e., have highest rigidity) in a particular direction, so that the layer combination provides the desired warping resistance.

Various methods may be used to deposit the materials forming the SBL 50. For example, the SBL 50 may be formed by an epitaxy process such as vapor phase epitaxy (VPE), molecular beam epitaxy (MBE), or complementary field effect transistor epitaxy (CMOSE). Sputtering and other methods may be used including physical vapor deposition (PVD). Preferably, a chemical vapor deposition (CVD) method is used. Various CVD methods include low pressure chemical vapor deposition (LPCVD), atmospheric pressure chemical vapor deposition (APCVD), metal-organic chemical vapor deposition (MOCVD), plasma-enhanced chemical vapor deposition (PECVD), and ultra-high vacuum chemical vapor deposition (UHVCVD), any of which may be used to produce a particular stress-balancing layer 50.

The SBL 50 may itself comprise an adhesive material, particularly when combined with added reinforcement particles. For example, polymeric materials known in the art may be applied to form a rigid structure, yet retain adhesive properties. Thus, semiconductor dice 20 formed therefrom may be adhesively attached to a circuit board or other substrate.

Figure 15:
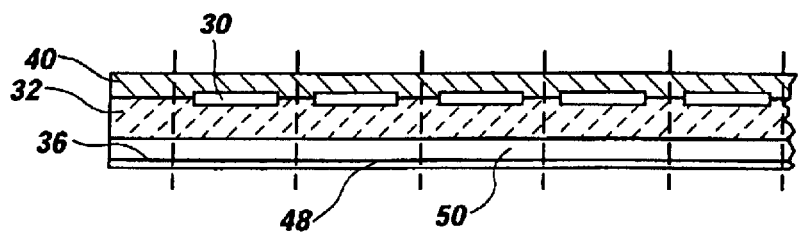
FIG. 15 is a cross-sectional view of a wafer following applying an adhesive layer to a stress-balancing layer on the thinned back side.
Figure 16:
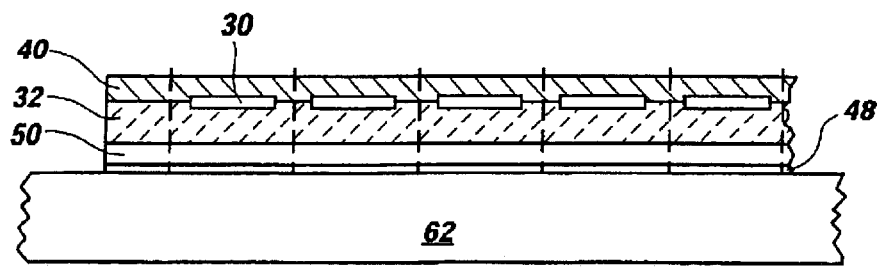
FIG. 16 is a cross-sectional view of wafer following attaching a carrier member to the stress-balancing layer in accordance with the invention.

In an alternative embodiment of the present invention, an adhesive layer 48 may be applied to the stress-balancing layer 50, as depicted in FIG. 15. The adhesive layer 48 may be formed of a type of adhesive material characterized as being epoxy, or other suitable adhesive material. This adhesive layer 48 may be used as a die attach adhesive, or may be used to temporarily attach a carrier tape 62 to the wafer 10, as in FIG. 16. As discussed, infra, the adhesive layer 48 may also comprise a markable material such as a UV acrylic, thio-phene, poly-paraxylylene, (Paralene), urethanes, silicones, and acrylics, provided its strength is sufficient to resist die warping. Carrier tapes 62 are generally used to protect and hold the semiconductor dice 20 in place during sawing of the wafer 10 and enable convenient pick-off of individual semiconductor die 20 for transfer to a substrate in a semiconductor die 20 attach step.

Another embodiment of the invention utilizes a tape as a stress-balancing layer 50, wherein stresses in the plane of the tape are resisted by rigidity. The tape may be monolayer or multilayer and may be formed of or include a metal film. It is important to utilize an adhesive which will rigidly adhere to the tape and semiconductor die 20 as a very thin film. The tape may be thinly adhesed on both sides, for temporary attachment to a carrier tape 62 or for permanent semiconductor die attach to a circuit board or other substrate, not shown in the figures.

Figure 18:
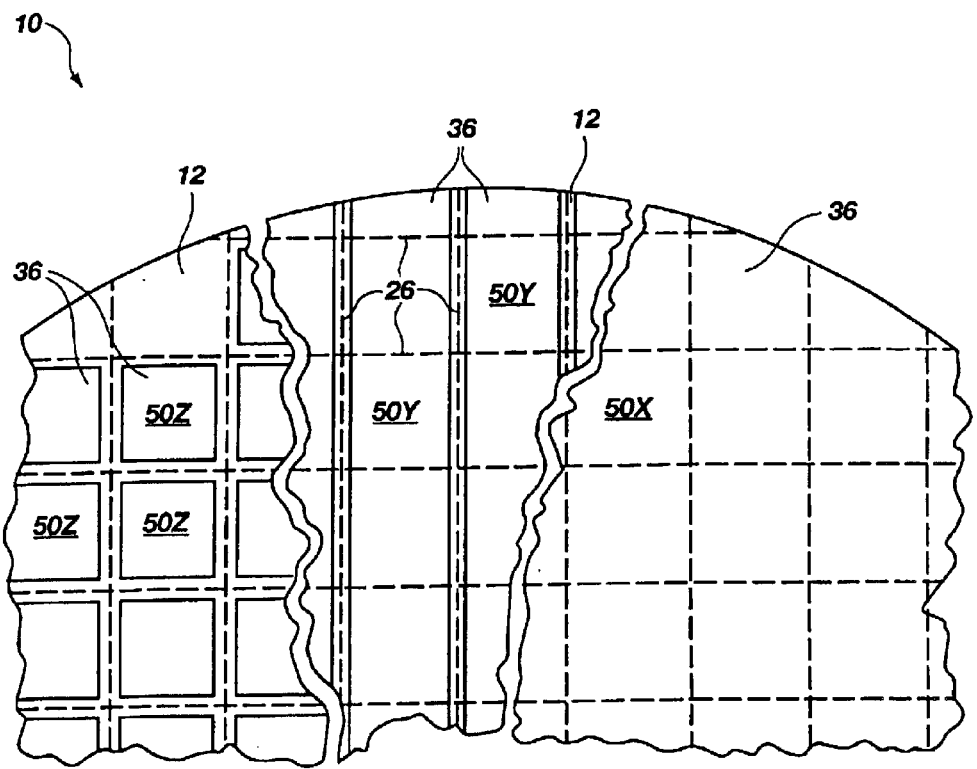
FIG. 18 is a view of the back side of exemplary portions of a semiconductor wafer to which three forms of a stress-balancing layer are applied in accordance with the invention.

Whether the stress-balancing layer 50 is applied as a tape or as a CVD layer, it may be applied to overcover the entire thinned ground surface 24, or alternatively cover selected portions of the wafer 10 or of each semiconductor die 20. For example, as shown in FIG. 18, an SBL 50 may be applied in various patterns of stress-balancing layers 50X, 50Y and 50Z on the thinned semiconductor die back side 12 of each semiconductor die 20 of a wafer 10. As shown in these examples, stress-balancing layer 50X is configured to cover the entire back side 12 as a contiguous layer. In another embodiment, the stress-balancing layer 50Y may be patterned, for example, as a continuous longitudinal strip extending over a row of semiconductor dice 20. In a further variation, stress-balancing layers 50Z are shown as discrete coverings for each individual semiconductor die 20. The SBL 50Z is shown as comprising a rectangular covering over a majority of a semiconductor die back side 12. However, it may comprise any pattern 68 which achieves the desired stress balancing. If applied as a tape, stress-balancing layer 50 may be applied by an automated process such that the tape is in a highly regular and standard pattern corresponding to placement on predetermined specific areas on the semiconductor dice 20, or on wafer areas which will correspond to individual semiconductor dice after singulation. As such, vision systems for reading marks on semiconductor dice can be adjusted to scan the desired marked areas. In the view of FIG. 18, the outer surface 36 of the stress-balancing layers 50X, 50Y or 50Z is uniformly planar for subsequent semiconductor die attach.

Although the stress-balancing layer 50 may be sometimes usefully applied to already singulated semiconductor die 20, it is preferred to apply stress-balancing layer 50 to the wafer ground surface 24 prior to singulation, because this avoids warpage resulting from singulation and is generally more cost-effective.

Figures 17A, 17B:
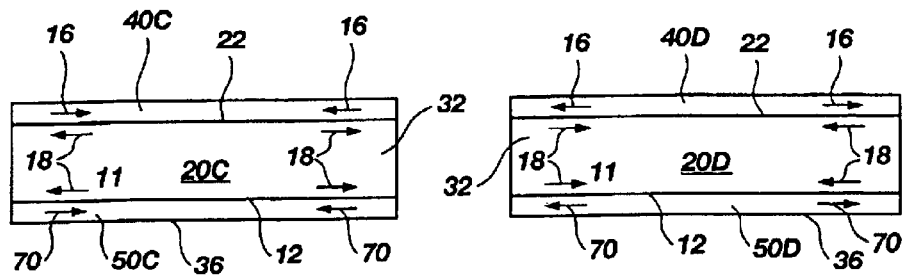
FIG. 17A is a side view of an exemplary semiconductor die formed in accordance with the invention, illustrating a balancing of compressive stress.
FIG. 17B is a side view of another exemplary semiconductor die formed in accordance with the invention, illustrating a balancing of tensile stress.

Exemplary semiconductor dice 20C and 20D formed by the method of the invention are illustrated in FIGS. 17A and 17B. As illustrated in FIGS. 17A and 17B, a stress-balancing layer 50C or 50D is applied to the back side 12 of a semiconductor die 20C, 20D, respectively. This stress-balancing layer 50C or 50D balances reactive stress forces 18 in semiconductor die 20C or 20D caused by compressive or tensile stress forces 16 in passivation layers 40C and 40D, and maintain the semiconductor dice in a generally warp-free condition. The counter forces 70 in the SBL 50C, 50D balance the warping forces 16 in the passivation layers 40C, 40D.

Figure 19:
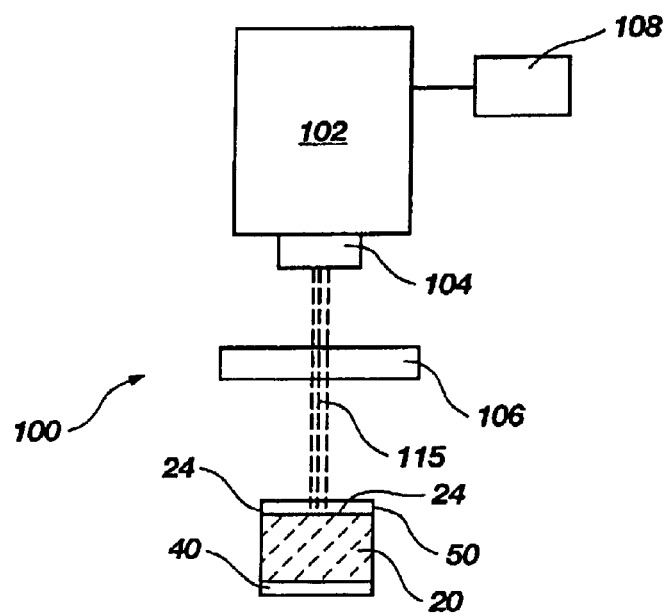
FIG. 19 is a simplified schematic view of a conventional laser marking system.

The SBL 50 is particularly useful when it, or an adhesive layer 48 applied thereto, is configured to be used as an indicia marking layer. FIG. 19 illustrates in a simplified schematic view of a conventional laser marking system 100 capable of readily marking semiconductor dice 20 to which a laser markable material has been applied. The system 100 comprises a laser 102, a lens system 104, a shadow mask 106 and a laser control system 108 for monitoring and controlling the function of the apparatus. For purposes of this invention, a "laser" is considered to be any optical energy source capable of marking a surface of a stress-balancing layer 50 through the use of light energy and/or heat. Preferably, laser 102 is comprised of an Nd:YAG (yttrium aluminum garnet), Nd:YLP (pulsed yttrium fiber laser), carbon dioxide, or other suitable optical energy devices known in the art. It is understood, however, that laser 102 may also comprise an ultraviolet (UV) energy source or other energy beam. When laser 102 is energized, an intense beam of light 115 is projected from lens system 104 through shadow mask 106 onto the surface of the laser-markable material (SBL 50 or adhesive layer 48 applied thereto). When laser beam 115 impinges on laser markable material SBL 50 or adhesive layer 48, the material in, on, embedded in, attached to or under the material is altered, e.g., by heating, vaporization, burning, melting, chemical reaction, residue or dye transfer, or combinations thereof. The result comprises a color or texture change, or both, having an image of shadow mask 106 appearing on the ground surface 24 of the semiconductor die 20. Although a shadow mask 106 is shown in this embodiment, the present invention contemplates computer-directed operation, including mechanical movement of laser 102 in conjunction with, or without, shadow mask 106.

The stress-balancing layer 50 may advantageously be formed of a material which also has antistatic properties.

The present invention is applicable to semiconductor dice of any electronic or physical configuration, in which stresses tending to warp the semiconductor dice are present. Thus, for example, the semiconductor die may be one of a DIP, SIP, ZIP, PLCC, SOJ, SIMM, DIMM, LCC, QFP, SOP, TSOP, flip-chip, etc.

Thus, in the present invention, a stress-balancing layer 50 may be formed on the ground surface 24 of a semiconductor wafer 10 to balance warping stresses in the subsequently singulated semiconductor dice 20. In addition, the stress-balancing layer 50 may be configured to be or support a markable layer on the die's thinned ground surface 24. The stress-balancing layer 50 may also be configured to comprise or support a semiconductor die attach adhesive or carrier adhesive.

The stress-balancing layer 50 which is applied to the back side 12, ground surface 24 of a thinned wafer 10 may comprise only a very small portion of the Z dimension of the subsequently singulated dice. The wafer thickness 42 of the SBL 50 will depend upon the footprint size and thickness of the die and will generally be larger as the footprint increases. Typically, for the stresses normally encountered in small semiconductor dice 20, i.e., less than about 10 mm in the X and Y dimensions and less than about 1.5 mm in the Z dimension, the wafer thickness 42 of the SBL 50 is generally less than about 0.1 mm and effectively prevents or counteracts the tendency to warp. The SBL 50 may be formed of the same material as the stress-causing passivation layer 40 and be of a similar wafer thickness 42.

While the present invention has been disclosed herein in terms of certain exemplary embodiments, those of ordinary skill in the art will recognize and appreciate that it is not so limited. Various combinations or modifications to the disclosed embodiments may be effected without departing from the scope of the invention. Moreover, features from one embodiment may be combined with features from other embodiments.

For example, this invention, while being described with reference to semiconductor wafers containing integrated circuits and individual semiconductor dice, has equal utility to any type of substrate in which compressive or tensile stresses require balancing. Furthermore, the invention finds added utility where two or more of stress balancing, marking, adhesion, and surface protection of a substrate are desired to be simultaneously achieved. The scope of the instant invention is only to be limited by the claims which follow and equivalents thereof.

What is claimed is:

1. A method for producing nonwarped semiconductor die from a wafer of a semiconductive material forming a substrate, said wafer of semiconductive material having a front side having integrated circuits formed on said semiconductive material, a back side, and a front side passivation layer on a portion of said wafer of semiconductor material causing a stress, said method comprising:
  reducing a cross-section of said nonwarped semiconductor die by thinning said semiconductive material from said back side of said substrate for said nonwarped semiconductor die;
  applying a stress-balancing layer to said wafer of semiconductor material substantially balancing said stress caused by said front side passivation layer; and
  singulating said wafer of semiconductor material into a plurality of semiconductor dice.

2. A method in accordance with claim 1, wherein said front side passivation layer comprises a layer applied in fabrication of said nonwarped semiconductor die.

3. A method in accordance with claim 1, wherein said front side passivation layer comprises a layer of passivation material.

4. A method in accordance with claim 1, wherein said thinning comprises grinding.

5. A method in accordance with claim 1, wherein said thinning comprises a chemical-mechanical method.

6. A method in accordance with claim 1, wherein said semiconductor die comprises an integrated circuit semiconductor die.

7. A method in accordance with claim 1, wherein said stress-balancing layer comprises a layer substantially covering said back side.

8. A method in accordance with claim 1, wherein said stress-balancing layer comprises a strip covering a selected portion of a row of semiconductor dice on said wafer of semiconductor material.

9. A method in accordance with claim 1, wherein said stress-balancing layer comprises a plurality of portions, each portion of said plurality covering a selected portion of said thinned nonwarped semiconductor die on said wafer of semiconductive material.

10. A method in accordance with claim 9, wherein said selected portion comprises a majority of said thinned nonwarped semiconductor die.

11. A method in accordance with claim 1, wherein said stress-balancing layer comprises a film.

12. A method in accordance with claim 1, wherein said stress-balancing layer comprises a layer applied to said thinned nonwarped semiconductor die by one of a chemical vapor deposition (CVD) process, an evaporation process, and an epitaxy process.

13. A method in accordance with claim 1, wherein said stress-balancing layer comprises a layer applied to said thinned nonwarped semiconductor die by one of LPCVD, APCVD, MOCVD, PECVD, and UHVCVD.

14. A method in accordance with claim 1, wherein said stress-balancing layer comprises a layer applied to said thinned nonwarped semiconductor die by one of VPE, MBE, and CMOSE.

15. A method in accordance with claim 1, wherein said stress-balancing layer comprises a single homogeneous component.

16. A method in accordance with claim 15, wherein said stress-balancing layer comprises one of a metal, alloy, metalorganic material, photoresist material, and an organic polymer.

17. A method in accordance with claim 1, wherein said stress-balancing layer comprises a heterogeneous composite structure comprising reinforcing particles in a solid matrix material.

18. A method in accordance with claim 17, wherein said reinforcing particles comprise inorganic particles.

19. A method in accordance with claim 17, wherein said reinforcing particles comprise one of a metal, an alloy, glass, and a combination thereof.

20. A method in accordance with claim 17, wherein said reinforcing particles comprise particles for providing reinforcement in the X-Y plane of said stress-balancing layer.

21. A method in accordance with claim 17, wherein said reinforcing particles comprise particles for providing reinforcement in the X, Y, and Z directions.

22. A method in accordance with claim 17, wherein said solid matrix material comprises one of silicon dioxide, silicon nitride, and an organic polymeric material.

23. A method in accordance with claim 1, wherein said nonwarped semiconductor die comprises one of a DIP, SIP, ZIP, PLCC, SOJ, SIMM, DIMM, LOC, QFP, SOP, TSOP, and a flip-chip.

24. A method in accordance with claim 1, wherein said stress-balancing layer comprises a material markable with indicia.

25. A method in accordance with claim 22, wherein said stress-balancing layer comprises a material markable by optical radiation energy.

26. A method in accordance with claim 22, wherein said stress-balancing layer comprises a polytetrafluoroethylene tape.

27. A method in accordance with claim 25, further comprising exposing a portion of said material markable with optical energy exposing at least a portion of said material markable to one of a Nd:YAG (yttrium aluminum garnet), Nd:YLP (pulsed yttrium fiber laser) or carbon dioxide laser.

28. A method for producing nonwarped semiconductor die from a wafer having a front side, a back side, and a front side layer on a portion of said wafer causing a stress, said method comprising:
  reducing a cross-section of said nonwarped semiconductor die by thinning said semiconductor die;
  applying a stress-balancing layer to said wafer; and
  applying a tape over said stress-balancing layer, said tape comprising a UV-penetrable polyvinyl chloride tape having an acrylic UV-sensitive adhesive disposed thereon;
  exposing a portion of said tape with optical energy exposing at least a portion of said tape to one of a Nd:YAG, Nd-YLP or carbon dioxide laser; and singulating said wafer into a plurality of semiconductor dice.

29. A method in accordance with claim 28, wherein said stress-balancing layer comprises a first sublayer having high rigidity in the X-direction and a second sub-layer having high rigidity in the Y-direction.

30. A method in accordance with claim 28, wherein said stress-balancing layer comprises a layer having a coefficient of thermal expansion substantially similar to a coefficient of thermal expansion of said front side layer.

31. A method in accordance with claim 28, further comprising applying a die-attach adhesive to at least a portion of a surface of said stress-balancing layer.

32. A method in accordance with claim 28, further comprising applying a temporary reinforcement layer over at least a portion of said front side layer prior to thinning said back side.

33. A method for producing a small Z-dimension nonwarped semiconductor die from a semiconductor wafer of a semiconductive material forming a substrate, said semiconductive wafer of said semiconductive material having a front side having integrated circuits formed on said semiconductive material, a back side, and a stress applied thereto by a front side passivation layer, said method comprising:

reducing a cross-section of said small Z-dimension nonwarped semiconductor die by thinning semiconductive material from said back side thereof;

applying a rigid stress-balancing layer to a portion of said thinned back side for substantially balancing said stress of said front side passivation layer; and singulating said semiconductor wafer into a plurality of nonwarped semiconductor dice.

34. A method in accordance with claim 33, wherein said front side passivation layer comprises a layer applied in a microcircuit fabrication step.

35. A method in accordance with claim 33, wherein said front side passivation layer comprises a layer of passivation material.

36. A method in accordance with claim 33, wherein said thinning comprises grinding by a grinding apparatus.

37. A method in accordance with claim 33, wherein said thinning comprises a chemical-physical method.

38. A method in accordance with claim 33, wherein said small Z-dimension nonwarped semiconductor die comprises an integrated circuit semiconductor die.

39. A method in accordance with claim 33, wherein said rigid stress-balancing layer comprises a layer substantially covering said thinned back side.

40. A method in accordance with claim 33, wherein said rigid stress-balancing layer comprises a strip covering a selected portion of a row of semiconductor dice on said semiconductor wafer.

41. A method in accordance with claim 33, wherein said rigid stress-balancing layer comprises a plurality of discrete portions, each of said plurality of discrete portion covering a selected portion of said thinned back side of a die on said semicondutor wafer.

42. A method in accordance with claim 41, wherein said selected portion comprises a majority of said thinned die back side.

43. A method in accordance with claim 33, wherein said rigid stress-balancing layer comprises a film.

44. A method in accordance with claim 33, wherein said rigid stress-balancing layer comprises a layer applied to said thinned back side by one of a chemical vapor deposition (CVD) process, an evaporation process, and an epitaxy process.

45. A method in accordance with claim 33, wherein said rigid stress-balancing layer comprises a layer applied to said thinned back side by one of LPCVD, APCVD, MOCVD, PECVD, and UHVCVD.

46. A method in accordance with claim 33, wherein said rigid stress-balancing layer comprises a layer applied to said thinned back side by one of VPE, MBE, and CMOSE.

47. A method in accordance with claim 33, wherein said rigid stress-balancing layer comprises a single homogeneous component.

48. A method in accordance with claim 47, wherein said rigid stress-balancing layer comprises one of a metal, alloy, metalorganic material, photoresist material, and an organic polymer.

49. A method in accordance with claim 33, wherein said rigid stress-balancing layer comprises a heterogeneous composite structure comprising reinforcing particles in a solid matrix material.

50. A method in accordance with claim 49, wherein said reinforcing particles comprise particles of inorganic material.

51. A method in accordance with claim 49, wherein said reinforcing particles comprise one of a metal, an alloy, and glass.

52. A method in accordance with claim 49, wherein said reinforcing particles comprise particles for providing reinforcement in the X-Y plane of said rigid stress-balancing layer.

53. A method in accordance with claim 49, wherein said reinforcing particles comprise particles for providing reinforcement in the X, Y, and Z directions.

54. A method in accordance with claim 49, wherein said solid matrix material comprises one of silicon dioxide, silicon nitride, and an organic polymeric material.

55. A method in accordance with claim 33, wherein said small Z-dimension nonwarped semiconductor die comprises one of a DIP, SIP, ZIP, PLCC, SOJ, SM, DIMM, LOC, QFP, SOP, TSOP, and a flip-chip.

56. A method in accordance with claim 33, wherein said rigid stress-balancing layer comprises a material markable with indicia.

57. A method in accordance with claim 56, wherein said rigid stress-balancing layer comprises a material markable by optical radiation energy.

58. A method in accordance with claim 56, wherein said rigid stress-balancing layer comprises a polytetrafluoroethylene tape.

59. A method for producing a small Z-dimension nonwarped semiconductor die from a semiconductor wafer having a front side, a back side, and a stress applied thereto by a front side layer, said method comprising:

reducing a cross-section of said small Z-dimension nonwarped semiconductor die by thinning said back side thereof;

applying a rigid stress-balancing layer to a portion of said thinned back side, said rigid stress-balancing layer comprising a material markable with indicia;

exposing a portion of said material markable with optical energy exposing at least a portion of said material markable to one of a Nd:YAG (yttrium aluminum garnet), Nd:YLP (pulsed yttrium fiber laser) or carbon dioxide laser; and singulating said semiconductor wafer into a plurality of nonwarped semiconductor dice.

60. A method for producing a small Z-dimension nonwarped semiconductor die from a semiconductor wafer having a front side, a back side, and a stress applied thereto by a front side layer, said method comprising:

reducing a cross-section of said small Z-dimension nonwarped semiconductor die by thinning said back side thereof;

applying a rigid stress-balancing layer to a portion of said thinned back side;

applying a tape over said rigid stress-balancing layer, said tape comprising a UV-penetrable polyvinyl chloride tape having an acrylic UV-sensitive adhesive disposed thereon;

exposing a portion of said tape with optical energy exposing at least a portion of said tape to one of a Nd:YAG, Nd-YLP, or carbon dioxide laser; and singulating said semiconductor wafer into a plurality of nonwarped semiconductor dice.

61. A method in accordance with claim 60, wherein said rigid stress-balancing layer comprises a first sublayer having high rigidity in the X-direction, and a second sublayer having high rigidity in the Y-direction.

62. A method in accordance with claim 60, wherein said rigid stress-balancing layer comprises a layer having a coefficient of thermal expansion substantially similar to that of said front side layer.

63. A method in accordance with claim 60, further comprising applying a die-attach adhesive to at least a portion of an outer surface of said rigid stress-balancing layer.

64. A method in accordance with claim 60, further comprising applying a temporary reinforcement layer over said front side layer prior to thinning said back side.

65. A method for producing low Z-dimension nonwarped semiconductor dice having a die front side, a die back side, and a stress applied thereto by a die front side passivation layer, said method comprising:

forming a semiconductor wafer of a semiconductive material, said semiconductive wafer of said semiconductive material having a front side, a back side, a plurality of microcircuits on said front side of said semiconductive material of said semiconductor wafer, and said die front side passivation layer applying stress to said semiconductor wafer;

reducing a cross-section of said semiconductor wafer by thinning said back side of said semiconductive material of said semicondutor wafer;

singulating said semiconductor wafer into a plurality of semiconductor dice; and applying a rigid stress-balancing layer to said thinned back side of said semiconductive material of said semiconductor wafer under conditions which apply a back side stress generally equivalent to said front side stress of said die front side passivation layer upon restoration to conditions of use of said low Z-dimension nonwarped semiconductor die.

66. A method in accordance with claim 65, wherein said die front side passivation layer comprises a layer of passivation material.

67. A method in accordance with claim 65, wherein said rigid stress-balancing layer comprises a layer applied to said back side by one of a chemical vapor deposition (CVD) process, an evaporation process, and an epitaxy process.

68. A method in accordance with claim 65, wherein said rigid stress-balancing layer comprises a layer applied to said back side by one of LPCVD, APCVD, MOCVD, PECVD, and UHVCVD.

69. A method in accordance with claim 65, wherein said rigid stress-balancing layer comprises a layer applied to said back side by one of VPE, MBE, and CMOSE.

70. A method in accordance with claim 65, wherein said rigid stress-balancing layer comprises a single homogeneous component.

71. A method in accordance with claim 70, wherein said rigid stress-balancing layer comprises one of a metal, alloy, metalorganic material, photoresist material, and an organic polymer.

72. A method in accordance with claim 65, wherein said rigid stress-balancing layer comprises a heterogeneous composite structure comprising reinforcing particles in a solid matrix material.

73. A method in accordance with claim 72, wherein said reinforcing particles comprises particles of inorganic material.

74. A method in accordance with claim 72, wherein said reinforcing particles comprise one of a metal, an alloy, and glass.

* * * * *

UNITED STATES PATENT AND TRADEMARK OFFICE
CERTIFICATE OF CORRECTION

PATENT NO. : 7,169,685 B2
APPLICATION NO. : 10/082372
DATED : January 30, 2007
INVENTOR(S) : Connell et al.

It is certified that error appears in the above-identified patent and that said Letters Patent is hereby corrected as shown below:

On the Title page, in "Assistant Examiner", in column 2, line 1, delete "AndréC. Stevenson" and insert -- André C. Stevenson --, therefor.

On the Title page, item (57), under "Abstract", in column 2, line 6, after "attach" delete ",".

On the Title page, item (57), under "Abstract", in column 2, line 7, delete "enhance" and insert -- enhanced --, therefor.

In column 11, line 1, in Claim 1, delete "semiconductor" and insert -- semiconductive --, therefor.

In column 11, lines 7-8, in Claim 1, delete "semiconductor" and insert -- semiconductive --, therefor.

In column 11, line 10, in Claim 1, delete "semiconductor" and insert -- semiconductive --, therefor.

In column 11, line 22, in Claim 6, after "said" insert -- nonwarped --.

In column 11, line 31, in Claim 8, delete "semiconductor" and insert -- semiconductive --, therefor.

In column 12, line 36, in Claim 28, after "said" insert -- nonwarped --.

In column 12, lines 63-64, in Claim 33, delete "semiconductive" and insert -- semiconductor --, therefor.

In column 13, line 31, in Claim 41, delete "portion" and insert -- portions --, therefor.

In column 13, line 33, in Claim 41, delete "semicondutor" and insert -- semiconductor --, therefor.

UNITED STATES PATENT AND TRADEMARK OFFICE
CERTIFICATE OF CORRECTION

PATENT NO. : 7,169,685 B2
APPLICATION NO. : 10/082372
DATED : January 30, 2007
INVENTOR(S) : Connell et al.

It is certified that error appears in the above-identified patent and that said Letters Patent is hereby corrected as shown below:

In column 14, line 13, in Claim 55, delete "SM" and insert -- SIMM --, therefor.

In column 15, line 12, in Claim 65, delete "semiconductive" and insert -- semiconductor --, therefor.

In column 15, line 20, in Claim 65, delete "semicondutor" and insert -- semiconductor --, therefor.

In column 16, line 26, in Claim 73, delete "comprises" and insert -- comprise --, therefor.

Signed and Sealed this

Eighth Day of April, 2008

JON W. DUDAS
*Director of the United States Patent and Trademark Office*